United States Patent
Dunn et al.

(10) Patent No.: US 7,078,796 B2
(45) Date of Patent: Jul. 18, 2006

(54) CORROSION-RESISTANT COPPER BOND PAD AND INTEGRATED DEVICE

(75) Inventors: Gregory J. Dunn, Arlington Heights, IL (US); Owen R. Fay, Gilbert, AZ (US); Timothy B. Dean, Elk Grove, IL (US); Terance Blake, Palatine, IL (US); Remy J. Chelini, Crystal Lake, IL (US); William H. Lytle, Chandler, AZ (US); George A. Strumberger, Gilberts, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/610,745

(22) Filed: Jul. 1, 2003

(65) Prior Publication Data

US 2005/0001324 A1   Jan. 6, 2005

(51) Int. Cl.
*H01L 23/48* (2006.01)
(52) U.S. Cl. .................. 257/690; 257/736; 438/612
(58) Field of Classification Search ................. 257/690, 257/736, 750, 781, 762, 748; 438/612, 678, 438/687, 614
See application file for complete search history.

(56) References Cited

U.S. PATENT DOCUMENTS

| | | | | |
|---|---|---|---|---|
| 4,786,564 A | * | 11/1988 | Chen et al. | ............ 428/694 TS |
| 4,863,766 A | * | 9/1989 | Iacovangelo et al. | .... 427/443.1 |
| 5,565,235 A | * | 10/1996 | Baudrand et al. | ............. 427/98 |
| 5,889,211 A | | 3/1999 | Maudie et al. | |
| 5,951,813 A | | 9/1999 | Warren | |
| 6,030,684 A | | 2/2000 | Polak et al. | |
| 6,362,089 B1 | * | 3/2002 | Molla et al. | ................ 438/612 |
| 6,401,545 B1 | | 6/2002 | Monk et al. | |
| 6,533,849 B1 | * | 3/2003 | Fang | ......................... 106/1.23 |
| 2002/0050170 A1 | | 5/2002 | Petrovic et al. | |

FOREIGN PATENT DOCUMENTS

EP    1 096 243 A2    5/2001
EP    1 096 243 A3    6/2002

* cited by examiner

*Primary Examiner*—Douglas W Owens
(74) *Attorney, Agent, or Firm*—Cardinal Law Group

(57) ABSTRACT

The invention provides an integrated device with corrosion-resistant capped copper bond pads. The capped copper bond pads include at least one copper bond pad on a semiconductor substrate. An activation layer comprising one of immersion palladium, electroless cobalt, or immersion ruthernium is disposed on the copper bond pad. A first intermediate layer of electroless nickel-boron alloy is disposed on the activation layer. A second intermediate layer comprising one of electroless nickel or electroless palladium is disposed on the first intermediate layer, and an immersion gold layer is disposed on the second intermediate layer. A capped copper bond pad and a method of forming the capped copper bond pads are also disclosed.

27 Claims, 5 Drawing Sheets

FIG. 4
Fig. 4a
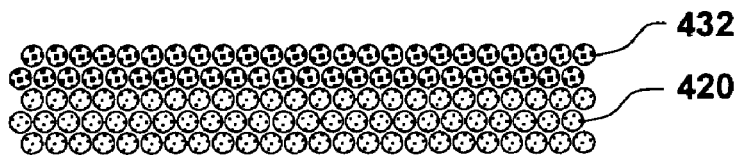
Fig. 4b
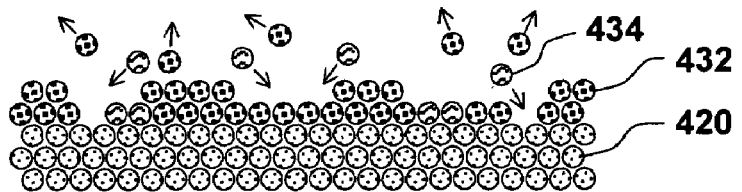
Fig. 4c
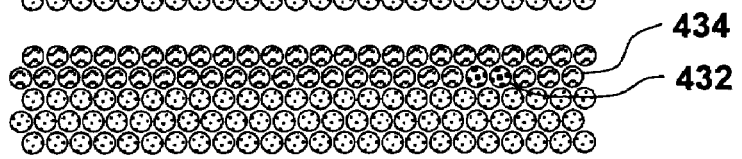
Fig. 4d
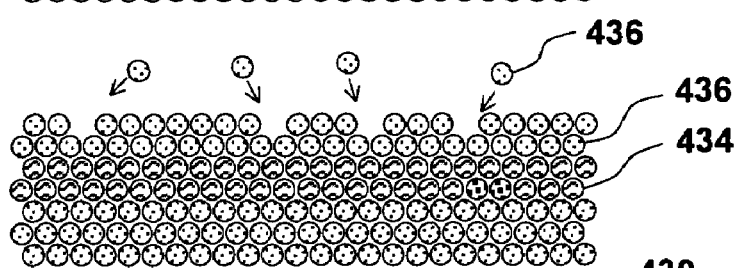
Fig. 4e
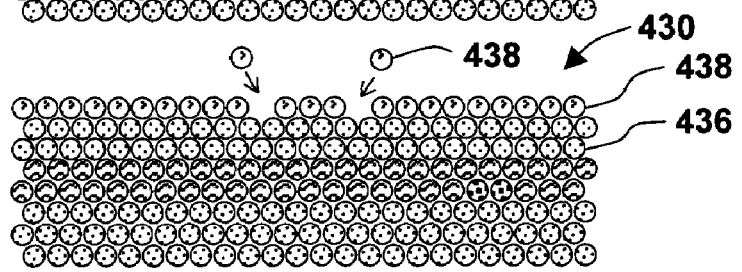
Fig. 4f
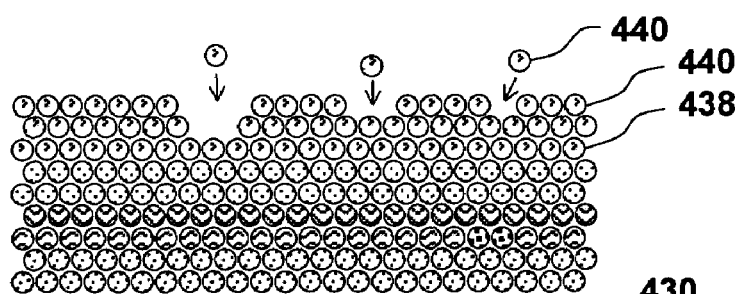
Fig. 4g
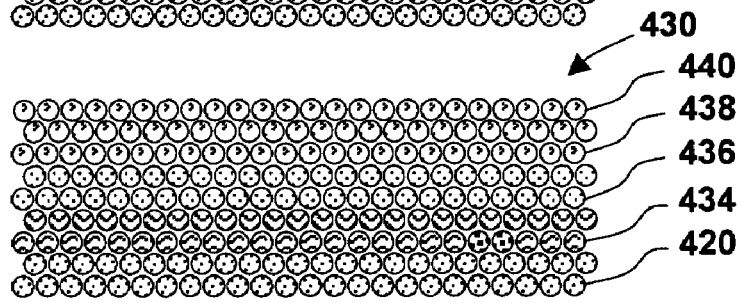

CORROSION-RESISTANT COPPER BOND PAD AND INTEGRATED DEVICE

FIELD OF THE INVENTION

This invention relates generally to semiconductor processing. More specifically, the invention relates to a corrosion-resistant capped copper bond pad for integrated circuits and sensors, and methods of forming the capped copper bond pad at the wafer, die and assembly level.

BACKGROUND OF THE INVENTION

Electronics assembly applications such as integrated circuits and silicon-based sensors generally include multiple layers of metal traces that terminate in metal bond pads through which electrical signals are transmitted. These bond pads need to be protected from environmental conditions such as high humidity, which are known to degrade the performance of an electronics assembly.

Bond pads are often made of aluminum because aluminum or gold bond wires are readily attached to the bond pads, yet the aluminum bond pads are susceptible to corrosion under standard environmental test conditions. This corrosion can cause performance degradation and product failure when the joint between a gold wire and an aluminum pad degrades and fails.

Semiconductor manufacturers have begun replacing aluminum bond pads on integrated circuits and sensors with copper bond pads, which have superior electromigration performance as well as lower resistivity. Copper is an attractive alternative to aluminum if manufacturing processes can avoid atmospheric contamination of the copper surface, which oxidizes to form a coating that is not readily removable by standard methods of wirebonding machines, and usually requires flux for soldering interconnections. Processing approaches have been developed for copper metallurgy to control or limit oxidation that tends to reduce the conductance of the copper bond pads.

A proposed solution for protecting metal bond pads of conventionally packaged, non-hermetic chip-on-board assemblies is to encapsulate the bonded die with a silicone compound, which helps isolate the pads from aggressive environmental conditions such as high humidity. Unfortunately, dispensing and curing the silicone is a time-consuming process. The silicone, having a higher dielectric constant and loss tangent than air, may cause a degradation of high-frequency and radio-frequency (RF) performance. In addition, silicone encapsulations are difficult to remove completely, precluding rework and repair.

The difficulty of protecting bond pads from environmental attack is acknowledged by Polak and others in "Protecting Electronic Components in Acidic and Basic Environment", U.S. Pat. No. 6,030,684 issued Feb. 29, 2000. In the proposed process, electronic components are encapsulated in a modified fluorosilicone with an acid-base buffer dispersed within the polymeric material. Unfortunately, fluorosilicones can degrade RF performance of RF devices operating at high frequencies and can be difficult to remove.

Inorganic protective thin films such as silicon nitride or oxide that have been used to protect microsensor structures are disclosed in "Media Compatible Microsensor Structure and Methods of Manufacturing and Using the Same", Maudie et al., U.S. Pat. No. 5,889,211 issued Mar. 30, 1999. The microsensor structure includes a microsensor package, a microsensor device, a leadframe, a connective wire, a leadframe, and an inorganic protective film formed on all or a portion of the exposed surfaces of the structure. The film or coating, which is vacuum-deposited, cannot be used with chip-on-board (COB) applications and is an expensive process, particularly when applied at the assembled device level.

A solution with selectively encapsulated bond pads has been proposed in "Micro Electro-Mechanical System Sensor with Selective Encapsulation and Method Therefor", Monk et al., U.S. Pat. No. 6,401,545 issued Jun. 11, 2002. Monk and others use selective encapsulation in which a polymeric or wafer-bonded silicon dam is used to prevent the flow of encapsulant onto a micromachined pressure sensor diaphragm, while allowing the encapsulant to still protect the wirebonds and pads. This approach does not address the RF performance and repairability problems for COB applications. The selective encapsulation of the microelectromechanical system (MEMS) sensor protects wirebonds, while permitting the pressure sensor diaphragm to be exposed to ambient pressure without encumbrance or obstruction.

Petrovic and others describe protecting a MEMS pressure sensor with a hydrophobic and oleophobic polytetrafluoroethylene filter, alone or in combination with silicone encapsulation in "Physical Sensor Component", European Patent Application EP 1,096,243 published May 2, 2001 and U.S. Patent Application US2002/0050170 published May 2, 2002. The housing of the physical sensor component has a cavity with a pressure sensor device mounted inside, and a chemically selective and physically selective filter overlying the cavity and separated from the pressure sensor device. While this approach is effective, it is not compatible with chip-on-board assembly applications and adds bulk.

A two-component encapsulation method that allows rework of an electronic module or removal of integrated circuits is described by Warren in "Top of Die Chip-on-Board Encapsulation", U.S. Pat. No. 5,951,813 issued Sep. 14, 1999. A first encapsulant is applied only to the bonds and pads on the die and a second more easily removed encapsulant is applied to the wire bond spans and wire bonds on the substrate. This more complex process is incompatible with MEMS sensing requirements and does not address the RF performance degradation problem for COB applications.

The copper surface of copper bond pads are generally not suitable as a terminal metal for packaging interconnections, and as a result, some manufacturers have coated the pads with other deposited metals such as palladium and nickel to reduce or eliminate voids in the copper or at the interface between the copper and the nickel. The copper bond pads may be activated with a thin layer of palladium in a palladium activation bath to allow deposition of a nickel layer thereon. One exemplary approach for coating copper bond pads is disclosed in "Method for Processing a Semiconductor Substrate Having a Copper Surface Disposed Thereon and Structure Formed", Molla et al., U.S. Pat. No. 6,362,089 issued Mar. 26, 2002. A dual activation process is used to produce a semiconductor wafer having metal-coated copper bond pads. The bond pads are activated in a palladium bath, placed in a nickel-boron bath, and then coated with a layer of nickel-phosphorous or palladium. In this process, the nickel-phosphorous or palladium layer is optionally coated with a layer of gold for subsequent formation of solder balls or wirebonds thereon.

It would be beneficial to provide an improved method for passivating and protecting wire-bondable copper bond pads of integrated circuits, sensors and chip-on-board assemblies from corrosion without requiring an encapsulation material such as silicone. In addition, such a method would result in circuits, sensors and assemblies that do not require a complex cleaning process, have repairable and reworkable bond pads, have improved reliability of electrical connections to the integrated circuits, and do not have degraded RF performance. The method would accommodate full wafers or singulated die from various vendors with varied pad metallurgy. The method would accommodate analog and digital integrated circuits, memory die, RF die, sensor die, sensor assemblies, wireless assemblies, and electronic assemblies. The finish would be wire bondable and corrosion resistant. The desired approach would allow low-cost plastic packages to be used in some copper bond-pad applications that have previously required costly, hermetic ceramic packages, and would overcome the deficiencies and obstacles described above.

SUMMARY OF THE INVENTION

One aspect of the invention provides an integrated device with a corrosion-resistant capped copper bond pad. The integrated device includes at least one copper bond pad on a semiconductor substrate with an activation layer comprising one of immersion palladium, electroless cobalt, or immersion ruthenium disposed on the copper bond pad. A first intermediate layer of electroless nickel-boron alloy is disposed on the activation layer, and a second intermediate layer comprising one of electroless nickel or electroless palladium is disposed on the first intermediate layer. An immersion gold layer is disposed on the second intermediate layer.

Another aspect of the invention provides a method of forming a corrosion-resistant capped copper bond pad. A plurality of copper bond pads on a semiconductor substrate is plated with an activation layer on the copper bond pads comprising an immersion palladium, an electroless cobalt, or an immersion ruthenium. A first intermediate layer of electroless nickel-boron alloy is plated on the activation layer, after which a second intermediate layer of electroless nickel or electroless palladium is plated on the first intermediate layer, and an immersion gold layer is plated on the second intermediate layer.

Another aspect of the invention provides a semiconductor wafer with a plurality of corrosion-resistant capped copper bond pads. The semiconductor wafer includes a plurality of copper bond pads on a surface of the semiconductor wafer with an activation layer comprising one of immersion palladium, electroless cobalt, or immersion ruthenium disposed on the copper bond pads. A first intermediate layer of electroless nickel-boron alloy is disposed on the activation layer, and a second intermediate layer comprising electroless nickel or electroless palladium is disposed on the first intermediate layer. An immersion gold layer is disposed on the second intermediate layer.

Another aspect of the invention provides a capped copper bond pad for a corrosion-resistant integrated device. The capped copper bond pad includes an activation layer of immersion palladium, electroless cobalt or immersion ruthenium disposed on at least one copper bond pad; a first intermediate layer of electroless nickel-boron alloy disposed on the activation layer; a second intermediate layer of electroless nickel-boron alloy or electroless palladium disposed on the first intermediate layer; and an immersion gold layer disposed on the second intermediate layer.

The present invention is illustrated by the accompanying drawings of various embodiments and the detailed description given below. The drawings should not be taken to limit the invention to the specific embodiments, but are for explanation and understanding. The detailed description and drawings are merely illustrative of the invention rather than limiting, the scope of the invention being defined by the appended claims and equivalents thereof. The foregoing aspects and other attendant advantages of the present invention will become more readily appreciated by the detailed description taken in conjunction with the accompanying drawings.

BRIEF DESCRIPTION OF THE DRAWINGS

Various embodiment of the present invention are illustrated by the accompanying figures, wherein:

FIG. 4 illustrates a method of forming a corrosion-resistant capped copper bond pad, in accordance with one embodiment of the current invention.

DETAILED DESCRIPTION OF THE PRESENTLY PREFERRED EMBODIMENTS

Figure 1:
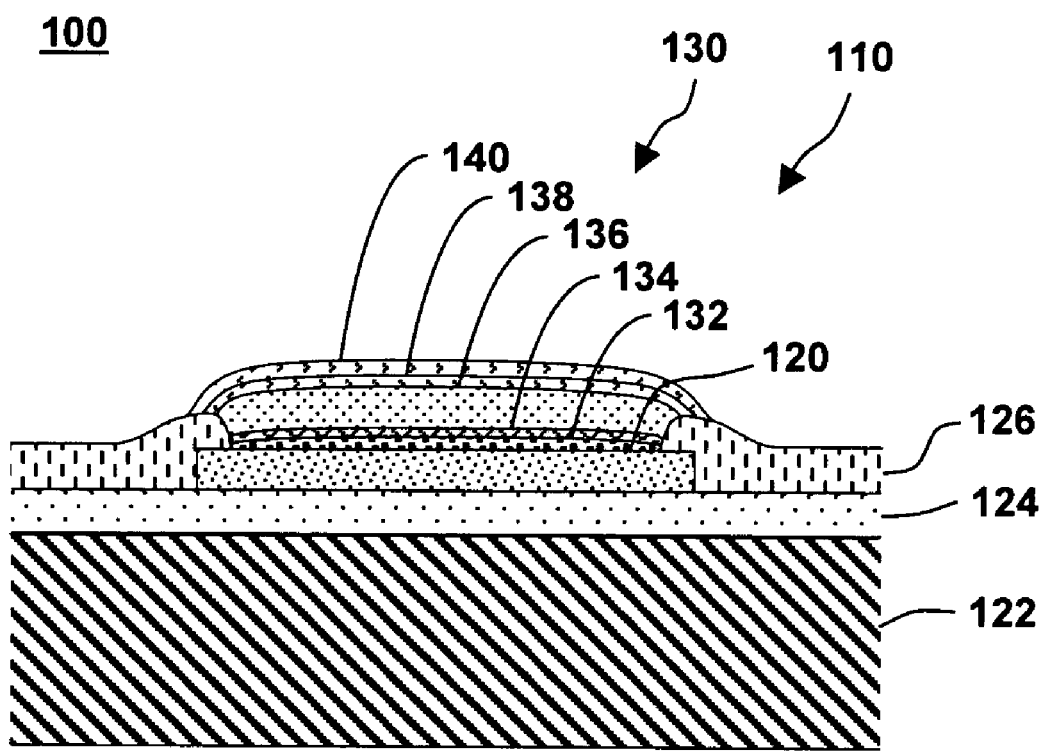
FIG. 1 illustrates a cross-sectional cutaway view of a capped copper bond pad on an integrated device, in accordance with one embodiment of the current invention.

FIG. 1 shows a cross-sectional cutaway view of a capped copper bond pad on an integrated device, in accordance with one embodiment of the present invention at 100. Capped copper bond pads 130 are typically located on the surface of an integrated device 110. Capped copper bond pads 130 provide for wirebonding and electrical connections between capped copper bond pads 130 and a package or assembly to which integrated device 110 is electrically connected, such as a plastic package, a ceramic package, or a sensor package. Capped copper bond pads 130 can be wirebonded to provide electrical connectivity between integrated device 110 and external power supplies, ground lines, input signals, output signals, data lines, address lines, other integrated devices, external electronic components, and other electrical and electronic devices. Integrated device 110 typically includes a plurality of capped copper bond pads 130. Integrated device 110 with capped copper bond pads 130 may be contained, for example, on an undiced semiconductor wafer or on an individual semiconductor integrated circuit or sensor die.

One or more insulating layers 124 electrically isolate capped copper bond pad 130 from a semiconductor substrate 122 such as a silicon substrate. Insulating layer 124 may comprise, for example, a layer of silicon dioxide, a layer of silicon nitride, or a combination of oxide and nitride. In certain embodiments, a passivation layer 126 covers the majority of the surface of integrated device 110 and protects the surface from scratches, abrasion, humidity, moisture and other chemicals that may come in contact with integrated device 110. Passivation layer 126 protects underlying metal traces, polysilicon traces, transistors, capacitors and other electronic devices that may be included with integrated device 110. Passivation layer 126 may be formed, for example, from a layer of plasma-enhanced vapor chemical deposition (PECVD) silicon nitride, a deposited layer of silicon dioxide, or a combination thereof. In an example, passivation layer 126 is patterned and etched to expose the majority of the surface of a copper bond pad 120, covering and overlapping the edges of copper bond pad 120. In an example, passivation layer 126 is patterned and etched after deposition to expose copper bond pads 120, which are then capped with a corrosion-resistant metal stack to form capped copper bond pads 130. Copper bond pads 120 are connected to at least one solid-state electronic device formed in semiconductor substrate 122.

Capped copper bond pads 130 are exposed to allow external wirebonds such as gold or aluminum wires to be attached to the pads. Alternatively, solder bumps and solder balls may be formed on capped copper bond pads 130 in the fabrication of, for example, flip chips, bumped area-array devices and chip-scale packages. Solder bumps and solder balls can provide connections to tape, leadframes, ceramic packages, plastic packages and other packages.

Capped copper bond pad 130 comprises a bond-pad metal such as copper or an alloy thereof. In an example, all of copper bond pads 120 and capped copper bond pads 130 on any particular integrated device 110 comprise the same metal or metal alloy. Additional metal layers such as barrier layers may be included directly underneath copper bond pad 120. Barrier metals include such metals as tungsten, titanium, titanium tungsten, titanium nitride, tantalum, tantalum nitride, tungsten nitride and related alloys, which help prevent intermetallic diffusion between the bond-pad metallurgy and the substrate or any underlying traces that may be connected to copper bond pad 120.

Integrated device 110 with copper bond pad 120 includes additional layers of metal plated on top of copper bond pad 120. The additional layers of metal provide improved wire bondability, solderability, corrosion resistance and reliability when compared to, for example, bare copper pads. An exemplary copper bond pad 120 has an activation layer 132 of immersion palladium, electroless cobalt, or immersion ruthenium disposed on copper bond pad 120; a first intermediate layer 134 of electroless nickel-boron alloy disposed on copper bond pad 120; a second intermediate layer 136 of electroless nickel or electroless palladium disposed on first intermediate layer 134; and an immersion gold layer 138 disposed on second intermediate layer 136. The electroless nickel of second intermediate layer 136 may include boron or phosphorus alloyed with the electroless nickel. An optional electroless gold layer 140 may be disposed on immersion gold layer 138. Other electroless and electroplated metals may be disposed on immersion gold layer 138, such as electroplated gold or solders often used for flip-chip assemblies.

In one embodiment, integrated device 110 with capped copper bond pad 130 comprises a copper bond pad 120 plated with an activation layer 132 of immersion palladium, electroless cobalt, or immersion ruthenium on copper bond pad 120; a first intermediate layer 134 of electroless nickel-boron alloy disposed on activation layer 132; a second intermediate layer 136 of electroless nickel disposed on first intermediate layer 134; and an immersion gold layer 138 disposed on second intermediate layer 136. The copper may contain additional materials such as copper or silicon. For example, copper bond pad 120 may have a thickness between 0.5 microns (micrometers) and 1.0 micron. Activation layer 132 may initially have a thickness between, for example, 0.05 microns and 0.25 microns, though activation layer 132 is displaced with the subsequent plating of first intermediate layer 134, often leaving only trace amounts. First intermediate layer 134 of electroless nickel-boron alloy may have a thickness between, for example, 0.1 microns and 0.5 microns, with a boron concentration between, for example, 0.1 percent and 5.0 percent by weight. Second intermediate layer 136 of electroless nickel may have a thickness between, for example, 0.5 microns and 7.5 microns. Second intermediate layer 136 of electroless nickel may include additional alloying materials, such as boron with a concentration between 0.1 percent and 5.0 percent by weight, or phosphorus with a concentration between 10.0 percent and 25.0 percent by weight. Immersion gold layer 138 may have a thickness between, for example, 0.05 microns and 0.25 microns. Immersion gold layer 138 may be plated with an additional electroless gold layer 140 using, for example, an electroless or autocatalytic process, resulting in a layer thickness between 0.1 micron and 1.5 microns or larger.

In another embodiment, integrated device 110 with capped copper bond pad 130 comprises a copper bond pad 120 plated with an activation layer 132 of immersion palladium, electroless cobalt, or immersion ruthenium on copper bond pad 120; a first intermediate layer 134 of electroless nickel-boron alloy disposed on activation layer 132; a second intermediate layer 136 of electroless palladium disposed on first intermediate layer 134; and an immersion gold layer 138 disposed on second intermediate layer 136. The copper may contain additional materials such as silicon. For example, copper bond pad 120 may have a thickness between 0.5 microns and 1.0 micron. Activation layer 132 may initially have a thickness between, for example, 0.05 microns and 0.25 microns, although activation layer 132 is typically displaced with the subsequent plating of first intermediate layer 134, sometimes leaving only trace amounts. First intermediate layer 134 of electroless nickel-boron alloy may have a thickness between, for example, 0.1 microns and 0.5 microns, with a boron concentration between, for example, 0.1 percent and 5.0 percent by weight. Second intermediate layer 136 of electroless palladium may have a thickness between, for example, 0.25 microns and 3.0 microns. Immersion gold layer 138 may have a thickness between, for example, 0.05 microns and 0.25 microns. Immersion gold layer 138 may be plated with an additional electroless gold layer 140 using, for example, an electroless or autocatalytic process, resulting in a layer thickness between 0.1 micron and 1.5 microns or larger.

In another embodiment, immersion gold layer 138 is plated directly on activation layer 132 comprising electroless cobalt. An electroless gold layer 140 may be plated onto immersion gold layer 138 to increase the gold thickness.

Capped copper bond pad 130 with the immersion gold configuration may be used, for example, with gold wirebonding to a plastic package, a ceramic package or a metal leadframe, or as an under-bump metallurgy (UBM) for a flip chip. Capped copper bond pad 130 with immersion gold and additional electroless or electroplated gold may be used, for example, with gold wirebonding to a plastic package, a ceramic package or a metal leadframe, or as an under-bump metallurgy.

Figure 2:
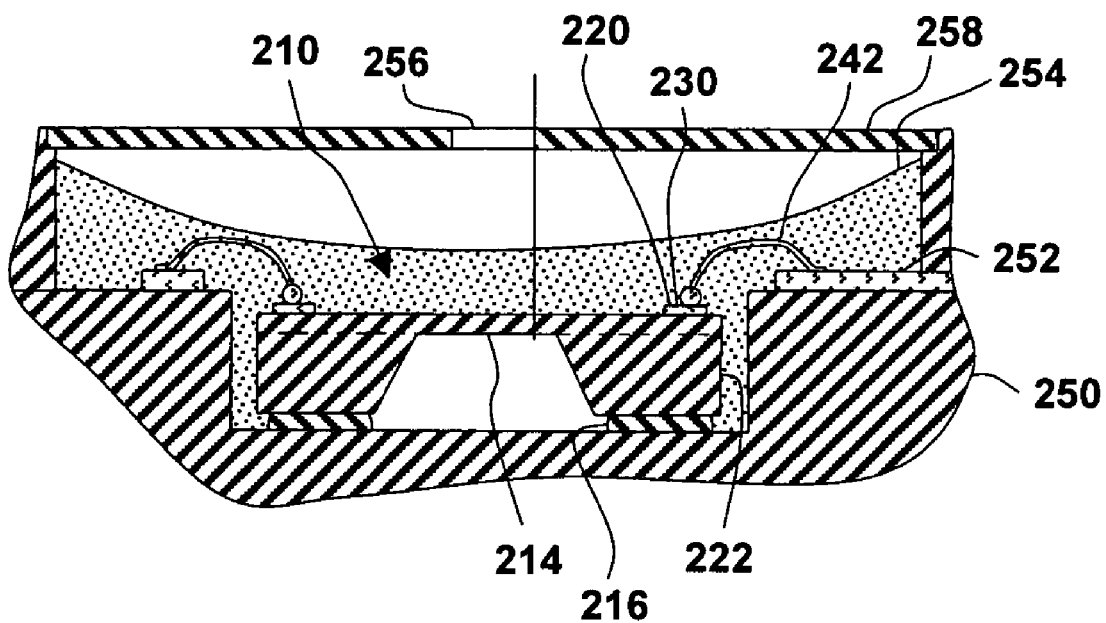
FIG. 2 illustrates a cross-sectional view of an integrated device with corrosion-resistant capped copper bond pads, in accordance with one embodiment of the current invention.

FIG. 2 shows a cross-sectional view of an integrated device with corrosion-resistant capped copper bond pads, in accordance with one embodiment of the present invention at 200. Integrated device with corrosion-resistant bond pads 200 includes an integrated device 210 such as a pressure sensor with a plurality of capped copper bond pads 230. In the example shown, a pressure-sensitive deformable diaphragm 214 is formed by anisotropic etching of a semiconductor substrate 222 such as a bulk silicon wafer. Integrated device 210 is attached to a device package 250 with an adhesive or a metal die bonding material 216. Electrical connections to a piezoresistive bridge formed on deformable diaphragm 214 or other electronic devices on integrated device 210 are made using bond wires 242 extending between capped copper bond pads 230 and portions of a metal leadframe 252. Leadframe 252 is generally connected to external pins or leads on the sides or bottom of device package 250. A silicone gel 254 or other suitable compound may be used to protect bond wires 242, leadframe 252, and integrated device 210 from harsh chemicals or water that can cause corrosion of any metal portions, and to provide additional mechanical and environmental protection for capped copper bond pads 230. A pressure port 256 in a lid 258 allows an external medium such as a gas or a liquid to deflect deformable diaphragm 214 and provide an output that is a measure of pressure of the external medium. Depending on the extent of integration, the output may be unamplified, amplified, compensated, formatted, networked, RF coupled or otherwise connectable to an external sensor interface.

Moisture, humidity, and other contaminants can cause corrosion of copper bond pads 220, unless suitably protected with a corrosion-resistant cap. Capped copper bond pads 230 include copper bond pads 220 on semiconductor substrate 222 of integrated device 210 with several layers of capping materials disposed on a surface of copper bond pads 220. The capping materials include an activation layer of immersion palladium, electroless cobalt or immersion ruthenium; a first intermediate layer of electroless nickel-boron alloy disposed on the activation layer; a second intermediate layer of electroless nickel or electroless palladium disposed on the electroless nickel-boron alloy, and a immersion gold layer disposed on the electroless nickel or electroless palladium. An additional electroless gold layer may be disposed on the immersion gold to provide a thicker layer for wirebonding.

Although a pressure sensor is illustrated in this embodiment, corrosion-resistant capped copper bond pads can be used with other integrated devices such as an integrated circuit, an analog circuit, a digital circuit, a radio-frequency device, a semiconductor sensor, an integrated sensor, a microelectromechanical (MEMS) device, a microoptoelectromechanical (MOEMS) device, a sensor assembly, an integrated circuit assembly, a wire-bonded assembly, or a combination thereof. The capped copper bond pads may be formed on discrete, singulated silicon die or on an entire silicon wafer prior to dicing.

Figure 3:
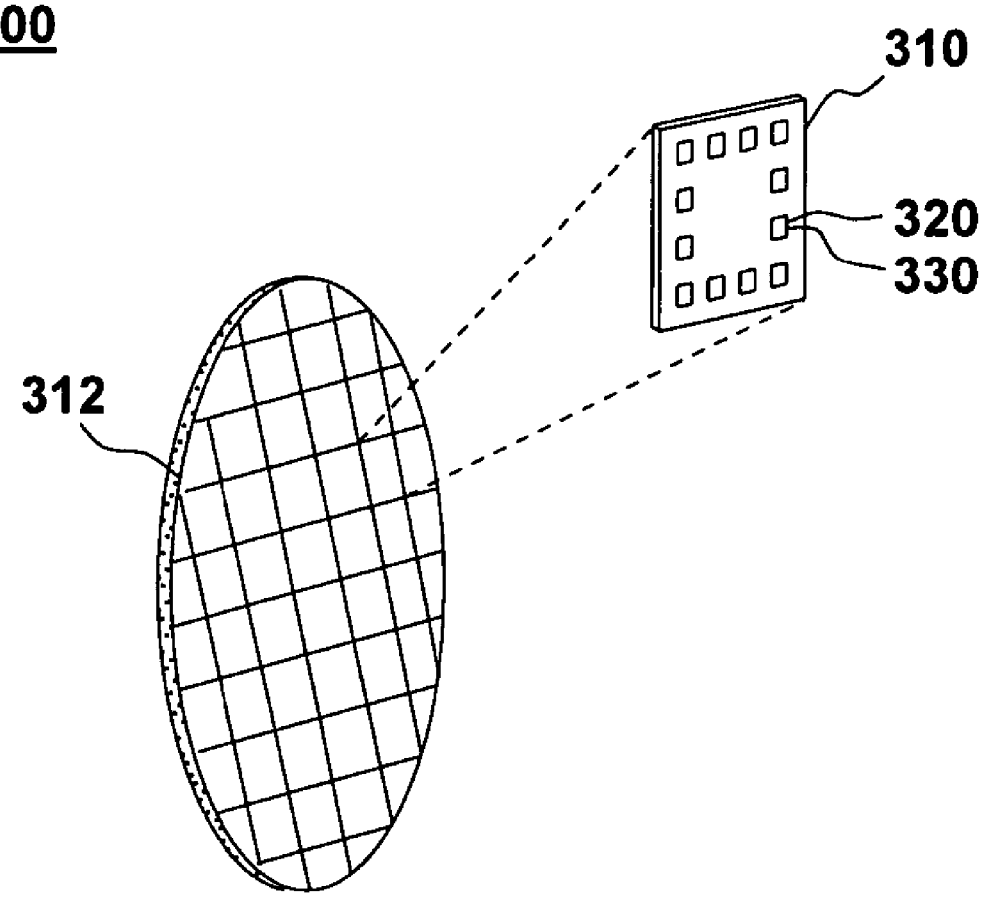
FIG. 3 illustrates a semiconductor wafer with a plurality of corrosion-resistant capped copper bond pads, in accordance with one embodiment of the current invention.

FIG. 3. shows a semiconductor wafer with a plurality of corrosion-resistant capped copper bond pads, in accordance with one embodiment of the present invention at 300. Semiconductor wafer with capped copper bond pads 300 includes an array of integrated devices 310 with a plurality of copper bond pads 320 on a surface of a semiconductor wafer 312. Semiconductor wafer 312 may comprise, for example, a silicon substrate, a silicon-on-insulator (SOI) substrate, or a bulk silicon wafer. Semiconductor wafer 312 may include, for example, an integrated circuit, an analog circuit, a digital circuit, a radio-frequency device, a semiconductor sensor, an integrated sensor, a pressure sensor, a MEMS device, a microoptoelectromechanical device, a wire-bondable device, or a combination thereof.

Copper bond pads 320 are capped to form corrosion-resistant capped copper bond pads 330. Capped copper bond pads 330 include an activation layer of immersion palladium, electroless cobalt or immersion ruthenium disposed on copper bond pads 320; a first intermediate layer of electroless nickel-boron alloy disposed on the activation layer; a second intermediate layer of electroless nickel or electroless palladium disposed on the electroless nickel-boron alloy; and a immersion gold layer disposed on the electroless nickel or electroless palladium. The electroless nickel-boron alloy is typically formed on the copper bond pad 320 by a displacement plating process, whereby a more active immersion palladium, electroless cobalt or immersion ruthenium layer on the surface of copper bond pad 320 is dissolved and replaced by a less active electroless nickel-boron alloy layer derived from a bath composition. An electroless gold layer may be disposed on the immersion gold to produce a thicker gold layer.

FIG. 4 shows cross-sections of a copper bond pad illustrating steps in a method of forming a capped copper bond pad, in accordance with one embodiment of the present invention at 400. The process cross-sections illustrate, from an atomic viewpoint, the formation of capped copper bond pads at various points in the capping process. The capping process selectively finishes or caps copper bond pads with gold to provide a corrosion resistant, wirebondable surface.

A plurality of copper bond pads 420 is provided on a semiconductor substrate such as a silicon wafer or a silicon die, as seen at FIG. 4*a*. Generally, all copper bond pads 420 undergo substantially the same operation at the same time due to the nature of the plating processes that are used. In an activation process, a surface of copper bond pad 420 is thinly coated with a layer of immersion palladium, electroless cobalt or immersion ruthenium. Any copper oxide on the surface of copper bond pads 420 is removed with a strong base in the activation layer bath, and a thin activation layer 432 of immersion palladium, electroless cobalt or immersion ruthenium replaces outer portions of copper bond pad 420. After the activation layer plating process is completed, activation layer 432 of immersion palladium, electroless cobalt or immersion ruthenium essentially coats the surface of copper bond pad 420.

A first intermediate layer 434 of electroless nickel-boron alloy is plated on activation layer 432 of copper bond pads 420, as seen at FIG. 4*b*. In an electroless nickel-boron plating process, first intermediate layer 434 of electroless nickel-boron alloy is plated on the activated surface of copper bond pads 420.

The activated surface is largely displaced with the electroless nickel-boron alloy, as seen at FIG. 4*c*. The plating solution removes much of activation layer 432 and any oxide that may be formed on the surface of activation layer 432. A thin portion of activation layer 432 may remain, though in many cases only a trace amount of the immersion palladium, electroless cobalt, or immersion ruthenium remains. While in the electroless nickel-boron plating bath, first intermediate layer 434 of electroless nickel-boron continues to grow thicker by autocatalytic reduction of nickel and boron from the plating solution onto the underlying nickel-boron alloy. The concentration of boron in the nickel-boron alloy is typically between 0.1 percent and 5.0 percent by weight.

A second intermediate layer 436 of electroless nickel or electroless palladium is plated onto first intermediate layer 434, as seen at FIG. 4*d*. Second intermediate layer 436 comprises an electroless nickel or an electroless palladium. In an electroless nickel-plating process, molecules of nickel are reduced and formed on the underlying material. The electroless nickel may include boron or phosphorus to toughen the plated metal. When boron is included, an exemplary concentration is between 0.1 percent and 5.0 percent by weight. When phosphorus is included, an exemplary concentration of phosphorus extends to between 10.0 percent and 25.0 percent. In an electroless palladium plating process, a layer of electroless palladium is plated onto a layer of electroless nickel-boron. The layer of electroless palladium is formed on first intermediate layer 434 of electroless nickel-boron by autocatalytic reduction of palladium in an electroless palladium plating solution.

In an immersion gold plating process, an immersion gold layer 438 is plated onto second intermediate layer 436, as seen at FIG. 4e. Gold ions from an immersion gold plating solution replace nickel or palladium atoms in a self-limiting process to form the thin immersion gold layer, forming capped copper bond pad 430.

An additional electroless gold layer 440 may be added to the immersion gold layer 438 using an electroless gold plating solution, as seen at FIG. 4f. Gold ions from an electroless gold plating solution add additional gold to the underlying gold layers, forming capped copper bond pad 430, as seen at FIG. 4g.

It should be noted that each of the plating processes described require no plating base, no external powered electrodes, and no electrical clips or connections to the chips or wafers. Die of varying sizes and functions can be suitably fixtured and capped at the same time. Since each plating process is autocatalytic and forms only on exposed portions of the underlying metal, there is no need for photolithographic steps such as photoresist application, photomask alignment and patterning, photoresist development and baking, and photoresist stripping steps. Nevertheless, additional electroplating steps with or without patterning sequences may be used as desired to form, for example, solder bumps or balls for flip chips, or to plate other metals onto the capped copper bond pads.

Figure 5:
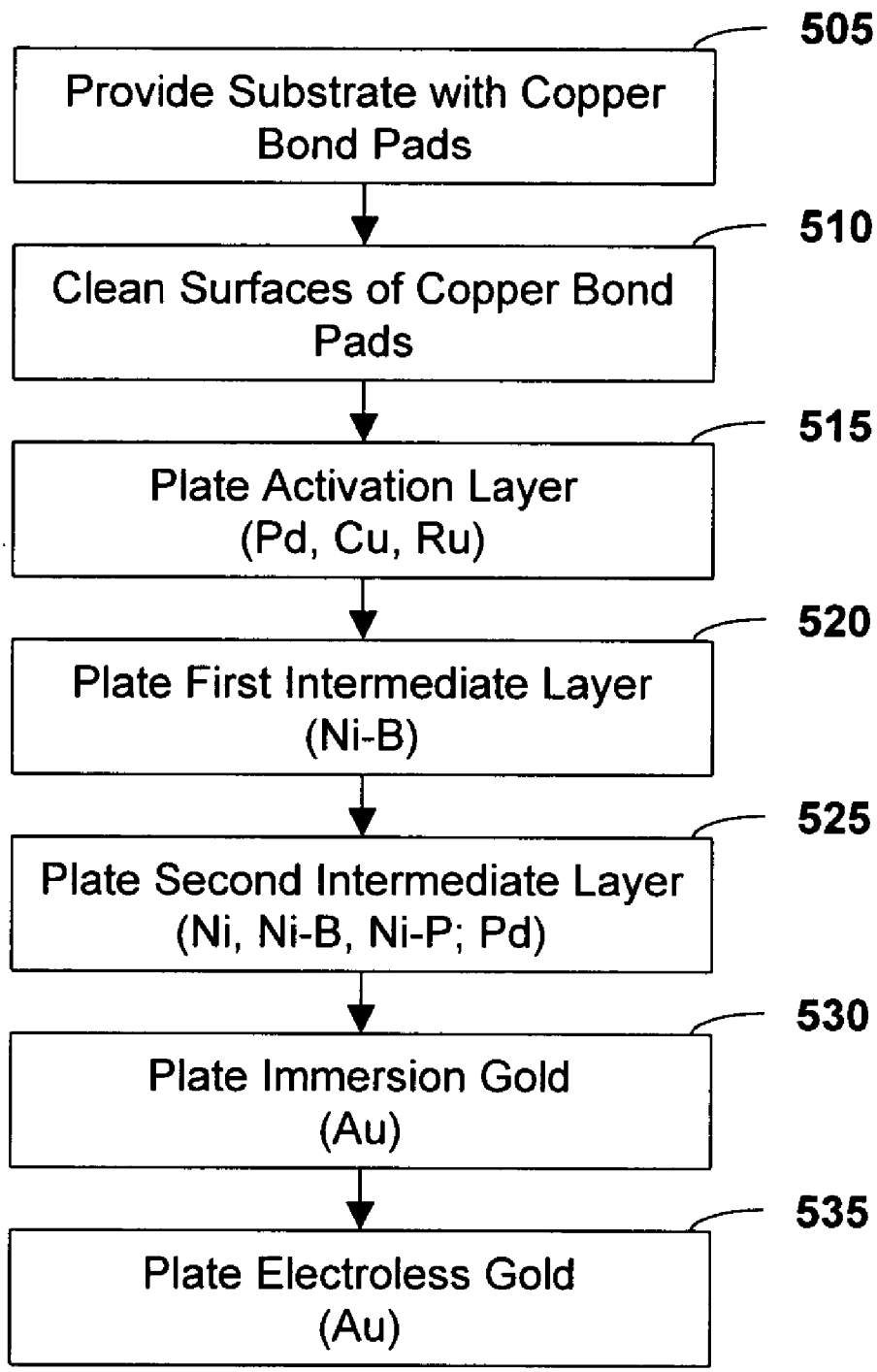
FIG. 5 is a flow diagram of a method of forming a corrosion-resistant capped copper bond pad, in accordance with one embodiment of the current invention.

FIG. 5 shows a flow diagram of a method of forming a corrosion-resistant capped copper bond pad, in accordance with one embodiment of the present invention at 500. Capped copper bond pad method 500 includes various steps to form a corrosion-resistant cap on a copper bond pad. The method allows the capping of copper bond pads on singulated integrated circuits, silicon wafers, and other integrated devices with a wirebondable gold cap. The gold cap reduces corrosion of the underlying copper bond pad under environmental stress conditions, and can eliminate the need for silicone encapsulation. In an exemplary embodiment, a layer of gold is not applied directly to the surface of the copper bond pads because the two metals can interdiffuse. Therefore, a nickel barrier layer and other materials are positioned between the two metals, using a multi-step process in which the copper surface is first plated with an activation layer of palladium, cobalt or ruthenium and the activated surface is then plated with nickel-boron and an additional layer of nickel or palladium to yield a corrosion-resistant, wirebondable finish for copper bond pads. The process can be used for underbump metallurgy for flip-chip solder bumping, integrated circuits, integrated sensors, and other integrated devices. The capping process comprises plating an activation layer on the copper bond pads, followed by plating with an electroless nickel-boron alloy, a layer of electroless nickel or electroless palladium, and an immersion gold layer (Cu—NiB—Ni—Au or Cu—NiB—Pd—Au) with the activation layer largely displaced when the nickel-boron is plated.

The process is based on low-cost electroless and immersion plating techniques. Electroless and immersion plating is preferred over sputter and e-beam deposition techniques because plating occurs only on exposed metal, and no masking layers are needed. This is particularly advantageous for processing multiple singulated die from various vendors, because the need for die-specific artwork and processing challenges of applying patterned layers to finished die are avoided. The process can be applied to singulated die or at the wafer level.

A semiconductor substrate with a plurality of copper bond pads is provided, as seen at block 505. The semiconductor substrate may comprise, for example, a silicon wafer, a silicon die or a plurality thereof. In this process, multiple wafers or multiple die can be capped at the same time. The semiconductor substrate includes an integrated device such as an integrated circuit, an analog circuit, a digital circuit, a radio-frequency device, a semiconductor sensor, an integrated sensor, a pressure sensor, a MEMS device, a MOEMS device, a sensor assembly, an integrated circuit assembly, a wire-bonded assembly, or a combination thereof. The semiconductor substrate may include, for example, an entire silicon wafer or a singulated die. An assembly of singulated die may be capped at the same time. Devices with copper bond pads can be capped using the bond-pad capping or finishing process. When capping multiple die in an assembly or on a fixture, integrated devices with as-fabricated gold pads can be processed along with integrated devices with copper pads, where all die with copper bond pads are plated.

To permit the handling and plating of singulated die as small as 20×20 mils, a carrier or a substrate holder may be used that is made from, for example, ceramic, glass, or aluminum. In one example of attaching the die to a carrier, acrylic enamel such as Krylon™ is swabbed onto the substrate surface for die attachment. The die are placed face up in a pool of acrylic enamel, and the acrylic enamel is allowed to air dry for ten minutes, followed by a ten-minute cure at 90° C. and a ten-minute cure at 120° C.

The nature of the electrical connections between the bond pads and the integrated device can affect plating uniformity. For example, certain bond pads may plate to a reduced height or not plate at all. In some cases, bond pads may plate poorly when directly connected to an area of silicon, such as the backside of the semiconductor wafer or die, that is directly exposed to the plating bath. Due to galvanic origins, this effect can occur with wet electrochemical processes such as activation layer plating and gold deposition.

Isolation of the semiconductor substrate from the plating solution can help diminish the plating disparities. Electrical isolation can be achieved, for example, by applying a polymer such as photoresist or an acrylic to the backside of the wafer. For example, clear acrylic enamel such as Krylon™ spray paint may be applied to the backside of the wafer prior to cleaning and plating. With singulated die, the die sidewalls that are exposed to the plating solution are also isolated.

In embodiments where the acrylic spray paint does not reliably cover the backside and sidewall surfaces of the die, a thin film dielectric is sputter-deposited on inverted die, coating the sidewalls and backside in one step. The die may be placed facedown on a suitable adhesive tape such as Kapton™ tape to secure them during the dielectric deposition process. After deposition, the die are removed from the adhesive tape and adhered face-up on a suitable carrier or substrate holder with the acrylic paint.

The surfaces of the copper bond pads are cleaned prior to plating, as seen at block 510. The copper bond pad surfaces may be cleaned, for example, by immersion or spraying with deionized water, solvents, or a sequence of solvents and water to remove particles, residues, contaminants and other unwanted materials.

In one example, a bond-pad cleaning step is used to remove organic and inorganic residues from the surface of the copper bond pads. A plasma ash is used for ten minutes at 75 watts with 10 percent oxygen and 90 percent carbon tetrafluoride to remove unwanted organic and nitride compounds from the bond pads. A non-silicated cleaner for cleaning and etching copper is used to prepare the copper bond pads for activation plating and electroless nickel-boron deposition. The cleaning solutions include active ingredients that do not appreciably dissolve silicon dioxide or silicon nitride that typically form the passivation layers on the integrated devices.

The semiconductor substrate is inserted into an activation layer plating solution to activate a surface of the copper bond pads, as seen at block 515. A thin activation layer of immersion palladium, electroless cobalt or immersion ruthenium is plated on the surface of the copper bond pads. In an example, any oxide formed on the surface of the copper bond pads is removed during the activation process. The palladium, cobalt or ruthenium is selectively plated onto the exposed metal of the bond pads. Activation of the copper bond pads provides a thin layer of palladium, cobalt or ruthenium on the surface of the copper bond pads, resulting in an improved surface for additional plated metals such as electroless nickel-boron alloy. The activation step may use one of the pre-mixed activation solutions available commercially for immersion palladium, electroless cobalt, or immersion ruthenium. The activation step may be repeated with a short intervening etch step in a process referred to as double activation. Details of immersion palladium plating can be found, for example, in U.S. Pat. No. 6,362,089 issued Mar. 26, 2002, the entire contents of which are hereby incorporated by reference.

An activation plate comprising a plate, disk or foil of copper can be placed in close proximity to the copper bond pads when in the activation plating solution to help improve uniformity and plating consistency. The activation plates are, in an example, activated at the same time as the bond pads. The activation plates are, in an example, positioned adjacent to the integrated devices or wafers, interleaved between each of the carriers or substrate holders. A typical activation plate comprises a material such as copper or a suitable copper alloy. The activation plate may be formed, for example, in the shape of the carrier or substrate holders with outer dimensions equal to the carrier or substrate holder and with a thickness that provides sufficient rigidity during use. In another example, the activation plate comprises a foil of copper that is placed into a plating tray or coupled to a backing plate, and then positioned in a plating tray or onto a carrier or substrate holder.

The use of an ionization activation plate during one or more of the plating steps can reduce the need for various cleaning cycles, remove the need for special procedures for problem integrated circuits with variable material compositions, reduce the grounded pad inconsistency, and reduce plating non-uniformities due to photovoltaic effects and bond pad composition variations. The activation plate involves the placement of a copper plate, sheet or foil with a large surface area close to the die surface to increase the area being plated, which in turn increases the local population of similarly charged ions. The bond pads are then surrounded by ions with an equivalent charge, neutralizing the galvanic activity and the photovoltaic effects. The result is uniform, consistent plating on all bond pads of each integrated device in the bath.

Production implementation of commercially available plating baths can use controlled plating modules, with customized filtration and automatic temperature controls that enhance reproducibility, reduce chemical usage, improve yields, and reduce process maintenance costs. The plating tanks are generally formed from non-plating materials such as polypropylene, polyvinyl chloride (PVC), quartz or Teflon™, and may include a cover, heaters, stirrers, timers, valves and pumps that help heat and regulate the plating solutions. In an exemplary embodiment, multiple plating tanks are used in a plating system, one for each type of plating solution, others for rinsing, and still others for cleaning. In a currently preferred embodiment, the tanks are of suitable size to accommodate the items to be plated, activation plates, and plating trays, carriers or substrate holders. The tanks may be large enough to accommodate, for example, a batch of semiconductor wafers that are 100 millimeters, 150 millimeters, 200 millimeters or 300 millimeters in diameter, or any standard size as is conventionally used in the industry. Carriers or substrate holders may comprise, for example, glass, ceramic, PVC, Teflon™, or other suitably rigid, non-plating material, and may accommodate one or more singulated die, integrated device assemblies, or entire wafers.

The singulated die may be of varying size and shape. In one example, an individual die has a size of 394 mils (thousandths of an inch) by 472 mils with a thickness of 22 mils, and 483 pads. In another example, a die has a size of 787 mils by 866 mils with a thickness of 22 mils, and a total of 220 bond pads. In another example, a die has a size of 86 mils by 98 mils, with 16 pads. In another example, the copper bond pads are square with an outer dimension of 100 microns by 100 microns, with a passivation layer that covers the edge of the bond pads and overlaps the pads by 5 microns on each side. The die may be attached to a carrier or substrate holder using, for example, a suitable tape or adhesive. In another example, pre-fabricated holders are used to attach integrated devices to the carriers and substrate holders.

Since copper and its alloys can form a stable, non-conductive oxide in the presence of water and air, the oxide re-forms after the die is removed from wet processing. Copper oxide ($Cu_2O$ or $CuO$) is resistant to dissolution in many electroless plating solutions, so it is necessary to replace the copper oxide with a more reactive oxide. In the activation process, the alkaline activation solution dissolves the copper oxide layer, and the palladium, cobalt or ruthenium then replaces the top layer of copper. The replacement reaction is diffusion limited, so the deposition reaction stops after a thin layer is deposited. The activation layer protects the copper from oxidation. The oxides that form on the activation layer when exposed to air or water readily dissolve in the electroless nickel-boron plating solution, allowing the nickel-boron plating to proceed.

Differences in bond-pad composition and surface conditions greatly affect the distribution, nucleation and size of the activation layer crystals. A repeated or double activation process can improve adhesion to and shear strength of a copper alloy. The activation process allows the activation of commercially available die from multiple vendors, accommodating a variety of metallurgies even with a potentially unknown alloy composition.

The bond pads are inspected after activation to insure adequate coverage with the palladium, cobalt or ruthenium. Poor or no activation can indicate the presence of silicon dioxide on the bond pads. The oxide may be removed, for example, with an ammonium-fluoride based pad etch such as Olin 777 etchant for 20 seconds at room temperature. The bond pads can then be re-activated and inspected. This process may be repeated as needed to improve activation layer coverage and to reduce pinholes and other yield-reducing effects on the bond pads.

A first intermediate layer of electroless nickel-boron alloy is plated on the activated surface of the copper bond pads, as seen at block 520. The semiconductor substrate with the activated copper bond pads and optional activation plates positioned adjacent to the integrated circuits are immersed in an electroless nickel-boron plating solution to substantially displace the activation layer and to replace it with electroless nickel-boron.

The commercially available electroless nickel-boron solution may be heated to a bath temperature of, for example, between 80 degrees centigrade and 90 degrees centigrade. The integrated devices are retained in the electroless nickel-boron bath until the desired thickness of electroless nickel is obtained. A plating time may be, for example, about 15 minutes. When plating is completed, the integrated circuits and the activation plates may be rinsed, usually with de-ionized water, and prepared for the next plating bath. In one example, the layer of electroless nickel-boron is plated to a thickness between about 0.1 microns and 0.5 microns. The boron concentration is typically between 0.1 percent and 5.0 percent by weight in the nickel-boron alloy. The result of the nickel-boron plating step is a layer of electroless nickel-boron on the bond pads and any activation plates.

In an example of electroless nickel-boron plating, a modified commercial electroless plating process is used to deposit a nickel-boron alloy. Electroless nickel plating is a controlled reduction of nickel ions onto a suitable catalyst. A pure nickel catalyst can be produced by immersion or replacement plating of nickel on the activation layer according to the following reactions for the cathodic deposition of nickel:

$$Pd^{0+} \rightarrow Pd^{2+} + 2e^- \quad (1a)$$

$$Co^{0+} \rightarrow Co^{2+} + 2e^- \quad (1a')$$

$$\tfrac{1}{2}Ru^{0+} + H_2O \rightarrow \tfrac{1}{2}RuO_2 + 2H^+ + 2e^- \quad (1a'')$$

$$Ni^{2+} + 2e^- \rightarrow Ni^0 \quad (1b)$$

The resultant nickel layer provides the catalyst for further deposition. The reaction is sustained by the subsequent autocatalytic deposition of the nickel-boron alloy.

Following the plating of the first intermediate layer of nickel-boron alloy, a second intermediate layer of electroless nickel or electroless palladium is plated, as seen at block 525. A modified commercial electroless nickel plating process can be used to produce a nickel, nickel-boron, or nickel-phosphorus alloy deposition. The underlying nickel-boron layer provides a suitable catalyst for the cathodic deposition of nickel, nickel-boron, or nickel-phosphorus. The resultant nickel layer provides the catalyst for further deposition, the chemical reaction being sustained by subsequent autocatalytic deposition of the nickel, nickel-boron or nickel-phosphorus alloy. The second intermediate layer of electroless nickel, which is plated to a thickness between, for example, 0.5 microns and 7.5 microns, may include boron as an alloying material, with a concentration between 0.1 percent and 5.0 percent by weight. Alternatively, the nickel layer may also include phosphorus as an alloying material, with a phosphorus concentration typically between 10.0 percent and 25.0 percent, and a presently preferred concentration being about 17.0 percent by weight.

The general deposition of nickel-phosphorus by hypophosphite ($H_2PO_2^-$) reduction can be represented by the following equations:

$$Ni^{2+} + H_2PO_2^- + H_2O \rightarrow Ni^{2+} + H_2PO_3^- + 2H^+ \quad (2a)$$

$$H_2PO_2^- + H_2O \rightarrow H_2PO_3^- + H_2 \quad (2b)$$

A variety of theories have been proposed to explain the entire process in detail, but there currently is no general agreement on the equation set. The basic concepts are that either atomic hydrogen or hydrides form as intermediates, which in turn reduce the $H_2PO_2^-$ to phosphorus and water.

The nickel-plating solution typically contains several constituents: a source of nickel ions (e.g., nickel sulfate), a reducing agent such as sodium hypophosphite ($NaH_2PO_2$), stabilizers, and suitable complexing agents that can also act as pH buffers. Reaction byproducts begin accumulating as soon as a deposit is made.

The primary function of the stabilizer is to prevent the spontaneous decomposition of the bath caused by rapid nucleation, which can result when the continuous increase of plating area in the bath is not constrained. These decomposed surfaces in the bath typically start from small particles on or irregularities such as scratches and seams of tank surfaces. As the affected surface area increases, the reaction becomes more efficient, and the rate of nucleation increases. Positive feedback in the absence of stabilizer eventually results in the decomposition and depletion of the bath.

Widely used lead-based stabilizers are generally not compatible with the application of electroless plating to semiconductor die, since the stabilizers similarly affect the reactions with the surface discontinuities of the bath and the integrated-circuit bond pads, which have a large edge-to-surface ratio of the bond pads. As an alternative, the plating process may use, for example, an oxyanion, a powerful oxidizer such as iodate ($IO_3^-$) ions, as the stabilizer. The inhibition mechanism involves the reaction of the hypophosphite anion rather than the poisoning of the catalysis reaction. The iodate stabilizer is a less powerful stabilizer than lead, allowing enough processing time for plating small integrated circuit pads.

Particulates that result from reactions occurring in the plating bath can be a source of bath instability. Insoluble nickel orthophosphite ($NiHPO_3$) tends to precipitate as the bath ages, which can lead to rough deposits and spontaneous bath decomposition. Filtration of the plating solution reduces deposit roughening, though accumulation of the precipitate in the filter can result in an increase in the effective plating surface area, detrimentally affecting bath stability. The use of certain complexing agents increases the solubility of $NiHPO_3$, allowing the bath to be reused with replenishment of stabilizer, nickel and hypophosphite. Examining the right side of the nickel-plating equations also shows $H^+$ as a byproduct. The resulting decrease in pH kinetically reduces the plating rate since $H^+$ is a reaction product. The complexing agents can also act as buffering agents to maintain bath pH and bath potency.

The plating baths can be highly sensitive to foreign materials. For example, the use of Teflon™ components can affect the plating process. When convex Teflon™ lids are used to cover the baths and are in contact with the plating solution, the nickel-plating chemistry is adversely affected, and nodule formation can occur on and around the integrated circuit bond pads. Because the Teflon™ does not wet, it can provide a nucleation surface for gas bubble formations that upset the pH balance of the bath. The problem can be avoided by use of glass lids.

Another contamination issue concerns flakes that can be generated when acrylic spray paint is used. The flaking problem sometimes appears when switching from ceramic to glass carriers. Pieces of the acrylic enamel coating on the glass carriers can separate during plating, presumably by a brittle fracture process related to stress built up during the bake cycle and poor adhesion of the acrylic paint to the glass. When there is a build-up of acrylic enamel contamination in the plating bath, the result is a deterioration of the plating quality. Replacing the plating chemistry and switching back to ceramic substrates can help solve the problem.

Once a nickel barrier has been established on the copper bond pad, a gold layer may be deposited to form a wirebondable finish. Immersion gold processes are commonly known, inexpensive, and simple to operate, yet the resulting gold finish on a finished bond pad is only a few micro-inches thick and generally too thin for consistent wirebonding. Additional gold layer thickness is possible by plating electroless gold onto the immersion gold layer. Plating electroless palladium on the nickel-boron prior to the immersion gold can also overcome this limitation.

Alternatively, the second intermediate layer may comprise an electroless palladium disposed on the electroless nickel-boron. A layer of electroless palladium is plated on the electroless nickel-boron when the semiconductor substrate is immersed in an electroless palladium plating solution until a target thickness is reached. The semiconductor substrate is removed from the electroless palladium plating solution and typically is rinsed.

Studies validate the wirebondability of Ni—Pd—Au. It is generally agreed that the palladium layer should be more than about 0.25 µm thick to prevent nickel diffusion through the palladium and onto the surface of the gold layer, which can adversely affect wirebonding. For example, the electroless palladium may be plated for about twenty minutes with a bath temperature of about 60 degrees centigrade. When plating is completed, the integrated circuits and any activation plate may be rinsed and prepared for the next plating bath.

In one example, the electroless palladium plating solution consists of a reducing agent, a stabilizer, $PdSO_4$ as a metal salt, and $H_2SO_4$, which helps retain the palladium in the solution. An acidic activator solution containing $NaHSO_4$ and $NaNO_3$ can be used prior to immersion plating to improve the adhesion of the palladium. The general processing steps of and concepts related to electroless palladium plating are similar to those of electroless nickel plating. The basic equations related to the nickel-boron plating as described above also depict the reaction at the nickel surface where the reduction and activation agents extract a few monolayers of nickel into the electroless palladium plating solution, which permit a reaction to then take place, reducing the palladium for plating onto the underlying nickel. The deposition of palladium onto the nickel-boron can be represented by the following equations:

$$Ni_0 \rightarrow Ni^{2+} + 2e^- \quad (3a)$$

$$Pd^{2+} + 2e^- \rightarrow Pd^0 \quad (3b)$$

As in electroless nickel plating, the initial palladium deposit then becomes the catalytic surface upon which the electroless palladium deposition reaction proceeds. Electroless palladium continues to form until the target thickness is reached, and the integrated device is extracted from the plating solution and rinsed. The electroless palladium may be plated, for example, to a thickness between about 0.25 microns and 3.0 microns.

An immersion gold layer is plated onto the electroless nickel or the electroless palladium, as seen at block 530. The semiconductor substrate is inserted into an immersion gold plating solution to form a thin immersion gold layer on the layer of electroless nickel or electroless palladium. The immersion gold typically requires an underlying layer of nickel or palladium, which allows gold molecules to be substituted for the nickel or palladium in a self-limiting process. The immersion gold may be plated to a thickness, for example, between about 0.05 microns and 0.25 microns where it tends to self-limit. For example, the immersion gold may be plated for a time of five minutes or more at a bath temperature of nominally 72 degrees centigrade. The immersion gold displaces a portion of the electroless nickel or palladium, and plates until a self-limiting thickness is reached where the plating rate subsides. The semiconductor substrate is removed from the immersion gold plating solution, rinsed and dried.

The thin gold finish is applied to the electroless nickel or palladium surface, providing oxidation resistance and reliable wirebonding. The gold deposition process, like the activation layer and the initial nickel deposit, is also an immersion process. The gold replacement reaction is:

$$Ni^0 \rightarrow Ni^{+2} + 2e^- \quad (4a)$$

$$Pd^0 \rightarrow Pd^{+2} + 2e^- \quad (4a')$$

$$Au(SO_3)_2^{-3} + 2e^- \rightarrow Au + 2SO_3^{-2} \quad (4b)$$

Plating variations can be caused by the photoelectric nature of the semiconductor substrate. Photoelectrons generated during plating in a lighted room can affect certain bond pads due to altered electrostatic potentials and the availability of photo-generated currents. The reaction rate can be increased on these pads, resulting in gold depositions that are thicker or have coarser grains. Shielding the plating baths from ambient light helps minimize this problem.

The immersion gold layer may be augmented with an additional electroless gold layer plated onto the immersion gold, as seen at block 535. The semiconductor substrate is inserted into a commercially available electroless gold plating bath, and an electroless gold layer is catalytically plated onto the immersion gold to form a thicker layer, as desired. When the target thickness is reached, the semiconductor substrate is extracted from the electroless gold plating bath, rinsed, dried, and inspected. The electroless gold may be plated to a thickness, for example, between 0.1 microns and 1.5 microns.

Additional plating steps for other metals or additional metals can be applied to the capped copper bond pads. For example, bumps comprising nickel, gold, indium, lead-tin, tin, tin-bismuth, tin-silver, or tin-silver-copper can be plated onto the capped copper bond pads for flip chips and chip-on-board (COB) applications. These processes typically require a plating layer, thick photoresist and photolithography, and electrodes connected to the semiconductor substrate.

When plating is completed, the integrated circuits and any activation plates may be rinsed and dried. The integrated circuits are removed from the carriers or substrate holders. Integrated circuits on a semiconductor wafer may be diced and prepared for additional packaging steps. The packaging steps include, for example, electroplating the bond pads with lead-tin solder, bumping or attaching solder balls for flip chips and ball-grid arrays, or placing the integrated circuits in packages and wire-bonding to the bond pads. The activation plates may be stripped and recycled, or discarded.

When wirebonded into a suitable package, the integrated device with capped copper bond pads may be encapsulated or otherwise coated with a silicone gel to provide mechanical protection and further environmental protection. Devices that can be detrimentally affected by the silicone encapsulation, such as high-frequency RF devices, can remain unencapsulated yet have the benefits of corrosion resistance for the capped copper bond pads.

Verification of the capping process and validation of reliability can be completed by selecting various integrated devices such as memory die, RF devices, integrated pressure sensors, or electronic assemblies with small and large bond pads. For example, integrated devices with capped copper bond pads are mounted on test substrates and wirebonded, and mounted on a motherboard for testing under bias for 1000 hours of 85 percent relative humidity and 85 degrees centigrade. Alternative tests include operating under bias for 448 hours of 95 percent relative humidity and 95 degrees centigrade. Visual inspections reveal any signs of corrosion or other problems. Comparison between silicone-gel coated devices and uncoated devices verify that silicone encapsulation is not required to assure reliability of capped copper bond pads. Selectively capped copper bond pads with the electroless finish can provide corrosion-resistant integrated circuit and sensor assemblies, while eliminating the need for silicone encapsulation. Applied at the wafer level, this process is attractive for integrated devices and packages that use silicone encapsulation, such as MEMS sensor applications, for which encapsulation can prevent or impede the MEMS device in the performance of its principal function of sensing the application environment. When applied at the wafer level, electroless plating offers significant cost savings compared to the material, dispense, and cure costs of encapsulating individual die on a package-by-package basis. In some applications, the use of capped copper bond pads allows devices to have low-cost plastic packages rather than expensive, albeit hermetic ceramic packages.

While the embodiments of the invention disclosed herein are presently preferred, various changes and modifications can be made without departing from the spirit and scope of the invention. The scope of the invention is indicated in the appended claims, and all changes that come within the meaning and range of equivalents are intended to be embraced therein.

What is claimed is:

1. An integrated device with a corrosion-resistant capped copper bond pad, comprising:
    at least one copper bond pad on a semiconductor substrate;
    an activation layer comprising one of immersion palladium, electroless cobalt, or immersion ruthenium disposed on the copper bond pad;
    a first intermediate layer of electroless nickel-boron alloy disposed on the activation layer;
    a second intermediate layer comprising one of electroless nickel or electroless palladium disposed on the first intermediate layer;
    an immersion gold layer disposed on the second intermediate layer; and
    an electroless gold layer disposed on the immersion gold, wherein the electroless gold layer has a thickness between 0.1 microns and 1.5 microns.

2. The integrated device of claim 1 wherein the integrated device is selected from the group consisting of an integrated circuit, an analog circuit, a digital circuit, a radio-frequency device, a semiconductor sensor, an integrated sensor, a pressure sensor, a microelectromechanical device, a microoptoelectromechanical device, a sensor assembly, an integrated circuit assembly, a wire-bonded assembly, and a combination thereof.

3. The integrated device of claim 1 wherein the semiconductor substrate comprises one of a silicon wafer or a silicon die.

4. The integrated device of claim 1 wherein the first intermediate layer of electroless nickel-boron alloy has a thickness between 0.1 microns and 0.5 microns.

5. The integrated device claim 1 wherein the first intermediate layer of electroless nickel-boron alloy has a boron concentration between 0.1 percent and 5.0 percent by weight.

6. The integrated device of claim 1 wherein the second intermediate layer of electroless nickel has a thickness between 0.5 microns and 7.5 microns.

7. The integrated device of claim 1 wherein the second intermediate layer of electroless nickel comprises boron alloyed with the electroless nickel, the boron having a concentration between 0.1 percent and 5.0 percent by weight.

8. The integrated device of claim 1 wherein the second intermediate layer of electroless nickel comprises phosphorus alloyed with the electroless nickel, the phosphorus having a concentration between 10.0 percent and 25.0 percent by weight.

9. The integrated device of claim 1 wherein the second intermediate layer of electroless palladium has a thickness between 0.25 microns and 3.0 microns.

10. The integrated device of claim 1 wherein the immersion gold layer has a thickness between 0.05 microns and 0.25 microns.

11. A method of forming a corrosion-resistant capped copper bond pad, comprising:
    providing a plurality of copper bond pads on a semiconductor substrate;
    plating an activation layer with one of immersion palladium, electroless cobalt, or immersion ruthenium on the copper bond pads;
    plating a first intermediate layer with electroless nickel-boron alloy on the activation layer;
    plating a second intermediate layer with one of electroless nickel or electroless palladium on the first intermediate layer;
    plating an immersion gold layer on the second intermediate layer; and
    plating an electroless gold layer on the immersion gold, wherein the electroless gold layer has a thickness between 0.1 microns and 1.5 microns.

12. The method of claim 11 wherein the provided semiconductor substrate comprises one of a silicon wafer or a silicon die.

13. The method of claim 11 wherein the first intermediate layer of electroless nickel-boron alloy is plated to a thickness between 0.1 microns and 0.5 microns.

14. The method of claim 11 wherein the first intermediate layer of electroless nickel-boron alloy is plated with a boron concentration between 0.1 percent and 5.0 percent by weight.

15. The method of claim 11 wherein the second intermediate layer of electroless nickel is plated to a thickness between 0.5 microns and 7.5 microns.

16. The method of claim 11 wherein the plated second intermediate layer of electroless nickel comprises boron alloyed with the electroless nickel, the boron having a concentration between 0.1 percent and 5.0 percent by weight.

17. The method of claim 11 wherein the plated second intermediate layer of electroless nickel comprises phosphorus alloyed with the electroless nickel, the phosphorus having a concentration between 10.0 percent and 25.0 percent by weight.

18. The method of claim 11 wherein the second intermediate layer of electroless palladium is plated to a thickness between 0.25 microns and 3.0 microns.

19. The method of claim 11 wherein the immersion gold layer is plated to a thickness between 0.05 microns and 0.25 microns.

20. A semiconductor wafer with a plurality of corrosion-resistant capped copper bond pads, comprising:
   a plurality of copper bond pads on a surface of the semiconductor wafer;
   an activation layer comprising one of immersion palladium, electroless cobalt, or immersion ruthenium disposed on the copper bond pads;
   a first intermediate layer of electroless nickel-boron alloy disposed on the activation layer;
   a second intermediate layer comprising one of electroless nickel or electroless palladium disposed on the first intermediate layer;
   an immersion gold layer disposed on the second intermediate layer; and
   an electroless gold layer disposed on the immersion gold, wherein the electroless gold layer has a thickness between 0.1 microns and 1.5 microns.

21. The semiconductor wafer of claim 20, wherein the semiconductor wafer comprises a silicon substrate.

22. The semiconductor wafer of claim 20, wherein the semiconductor wafer comprises an integrated device selected from the group consisting of an integrated circuit, an analog circuit, a digital circuit, a radio-frequency device, a semiconductor sensor, an integrated sensor, a pressure sensor, a microelectromechanical device, a microoptoelectromechanical device, a wire-bondable device, and a combination thereof.

23. The semiconductor wafer of claim 20 wherein the second intermediate layer of electroless nickel comprises boron alloyed with the electroless nickel, the boron having a concentration between 0.1 percent and 5.0 percent by weight.

24. The semiconductor wafer of claim 20 wherein the second intermediate layer of electroless nickel comprises phosphorus alloyed with the electroless nickel, the phosphorus having a concentration between 10.0 percent and 25.0 percent by weight.

25. A capped copper bond pad for a corrosion-resistant integrated device, comprising:
   an activation layer comprising one of immersion palladium, electroless cobalt, or immersion ruthenium disposed on at least one copper bond pad;
   a first intermediate layer of electroless nickel-boron alloy disposed on the activation layer;
   a second intermediate layer comprising one of electroless nickel or electroless palladium disposed on the first intermediate layer;
   an immersion gold layer disposed on the second intermediate layer; and
   an electroless gold layer disposed on the immersion gold, wherein the electroless gold layer has a thickness between 0.1 microns and 1.5 microns.

26. The capped copper bond pad of claim 25 wherein the second intermediate layer of electroless nickel comprises boron alloyed with the electroless nickel, the boron having a concentration between 0.1 percent and 5.0 percent by weight.

27. The capped copper bond pad of claim 25 wherein the second intermediate layer of electroless nickel comprises phosphorus alloyed with the electroless nickel, the phosphorus having a concentration between 10.0 percent and 25.0 percent by weight.

* * * * *